United States Patent
Wu (10) Patent No.: US 6,530,804 B1
(45) Date of Patent: Mar. 11, 2003

(54) BATTERY HOLDER

(75) Inventor: Jerry Wu, Tu-Chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/121,068

(22) Filed: Apr. 11, 2002

(51) Int. Cl.[7] .................................................. H01R 3/08
(52) U.S. Cl. ........................ 439/500; 439/621; 439/680; 439/830; 439/867
(58) Field of Search ............................... 439/500, 680, 439/867, 698, 621, 622, 627, 830

(56) References Cited

U.S. PATENT DOCUMENTS 5,980,309 A * 11/1999 Frantz et al. ................ 439/500
6,087,037 A * 7/2000 Rieder ............................ 429/99

\* cited by examiner

*Primary Examiner*—P. Austin Bradley
*Assistant Examiner*—Truc Nguyen
(74) *Attorney, Agent, or Firm*—Wei Te Chung (57) ABSTRACT

A battery holder (1) includes a dielectric housing including a base (20), a pair of upwardly extending end walls (21, 22) at opposite ends of the base, and a pair of upwardly extending side beams (23) located between the end walls to define a receiving space (202) thereamong, and a pair of conductive contacts (3) retained in the end walls of the housing. One of the end walls defines a keyway (214) communicating with the receiving space for ensuring a blindly correct insertion of a battery (4). The side beams have inward hooks (230) for retaining the battery in the housing. Each contact includes a resilient arm (32) extending into the receiving space for electrically biasing against a corresponding end of the battery and a tail portion (34) extending beneath the base for electrically connecting to a circuit board.

1 Claim, 10 Drawing Sheets

BATTERY HOLDER

BACKGROUND OF THE INVENTION

1. Field of the Invention

The present invention relates to a battery holder, and particularly to a battery holder mounted on a circuit board of a desktop computer.

2. Description of Related Art

Battery holders are used for holding various forms of batteries, such as back up batteries for rear time clocks in desktop computers. These batteries are typically ½AA batteries for conducting current to a circuit board of a desktop computer on which the holders are mounted. Conventional battery holders are typically disclosed in "Connector Specifier" published on January 1997 and U.S. Pat. Nos. 5,211,579, 5,537,022, 5,528,460, 5,395,263 and 5,431,575. A battery holder disclosed in U.S. Pat. No. 5,537,022 is of two-piece configuration including a seat in which a battery is received and a cover snapping over the seat to hold the battery in the seat against removal. However, assembling the cover to the seat is time-consuming. In addition, the seat and the cover are of different configuration due to their distinct functions, thereby requiring different molds to form them. Thus, the manufacturing cost is increased.

U.S. Pat. No. 5,211,579 discloses a battery holder addressing to the problem encountered by the '022 patent. The battery holder is of one-piece configuration comprising an insulating housing having a pair of opposite end walls and a pair of side walls to define a space for securely receiving a battery therein, and a positive and a negative contact respectively fixed adjacent to the end walls. The end walls are spaced from each other along a longitudinal direction of the housing to define an opening having a length which is at least about equal to that of the battery. One of the end walls defines a recess for receiving a negative end of the battery. When the battery is inserted into the space of the housing through the opening along a horizontal direction, a positive end of the battery will first bias a latch projection of the positive contact. Once the battery has been fully inserted into the housing, the positive contact will resiliently urge the battery to move toward the negative contact resulting in the negative end of the battery entering the recess and being brought to electrically abut against the negative contact. Simultaneously, the latch projection of the positive contact overlies the positive end of the battery for holding the battery against removal from the housing. However, incorrect installation of the battery resulted-from negligence will bring a malfunction of the computer. Moreover, once the battery is received and retained in the battery holder, it is difficult to remove the battery from the battery holder.

Hence, an improved battery holder is required to overcome the disadvantages of the related art.

SUMMARY OF THE INVENTION

Accordingly, a first object of the present invention is to provide a battery holder which can blindly receive a battery therein, thereby ensuring a correct connection between the battery and corresponding conductive contacts of the battery holder.

A second object of the present invention is to provide a battery holder having particular configuration for facilitating easy removal of a battery therefrom.

In order to achieve the objects set forth, a holder for holding a battery in accordance with the present invention comprises a dielectric housing including a base, a pair of upwardly extending end walls at opposite ends of the base and a pair of upwardly extending side beams located between the end walls, and a pair of conductive contacts retained in the end walls of the housing. One of the end walls defines a keyway in a top surface thereof to communicate with the receiving space for ensuring a blindly correct insertion of a battery. The side beams have inward hooks for holding the battery against removal from the housing. Each contact includes a body portion having spring tabs integrally formed thereon for being interferentially retained in the end wall, an upwardly extending resilient arm projecting into the receiving space for electrically connecting with the battery and a tail portion extending beneath the base for electrically connecting to a circuit board.

Other objects, advantages and novel features of the invention will become more apparent from the following detailed description when taken in conjunction with the accompanying drawings.

DETAILED DESCRIPTION OF THE INVENTION

Figure 1:
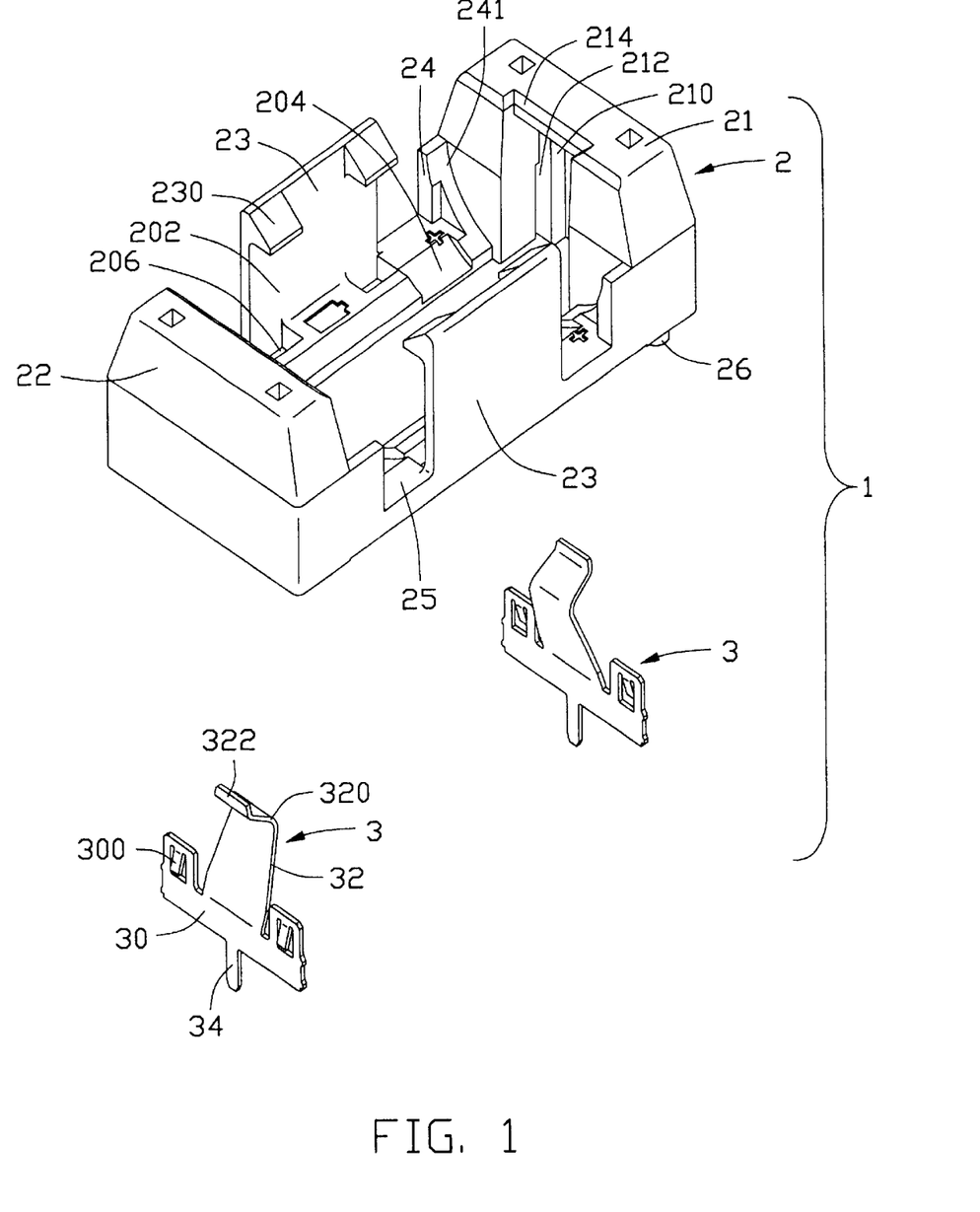
FIG. 1 is an exploded, perspective view of a battery holder in accordance with the present invention.
Figure 2:
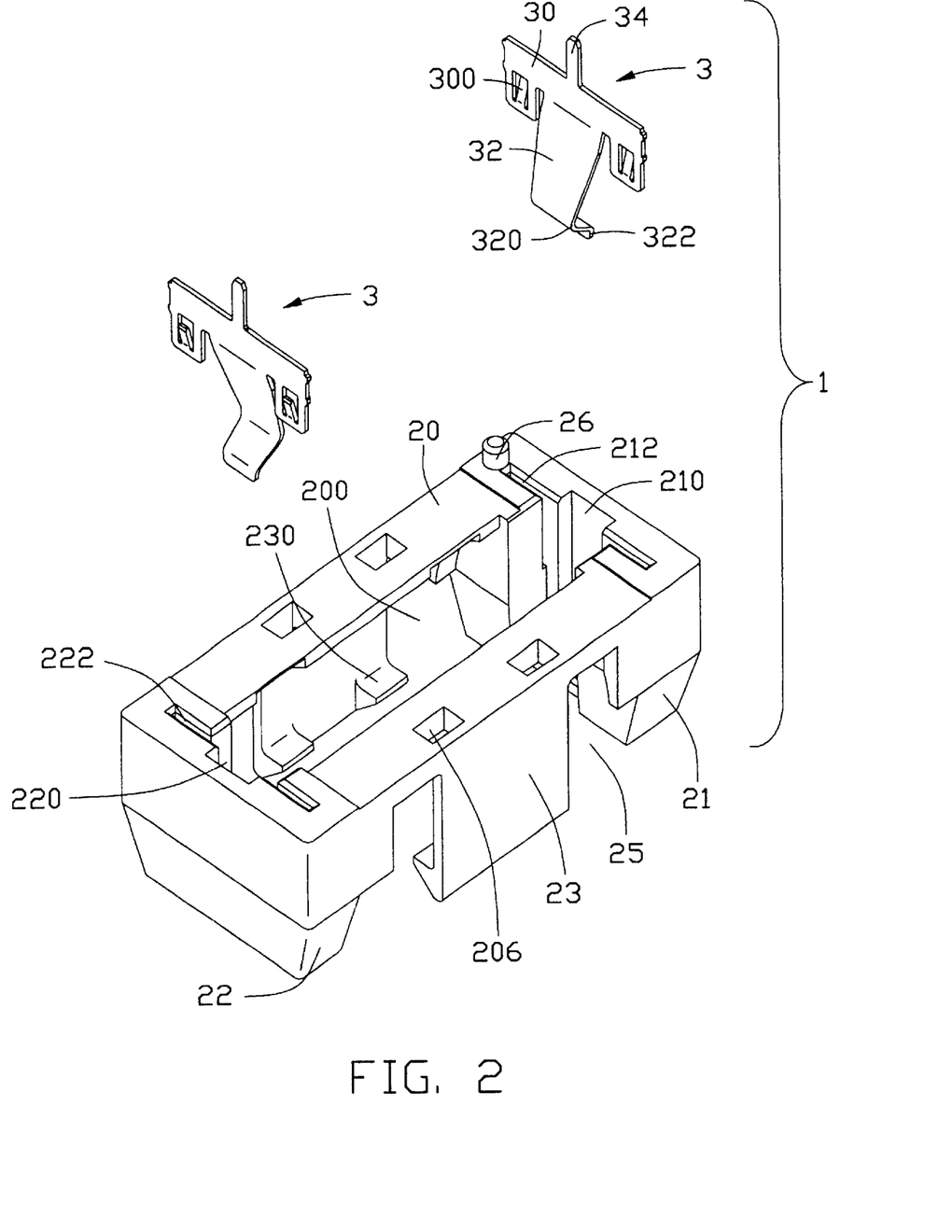
FIG. 2 is an another exploded, perspective view of the battery holder shown in FIG. 1.
Figure 3:
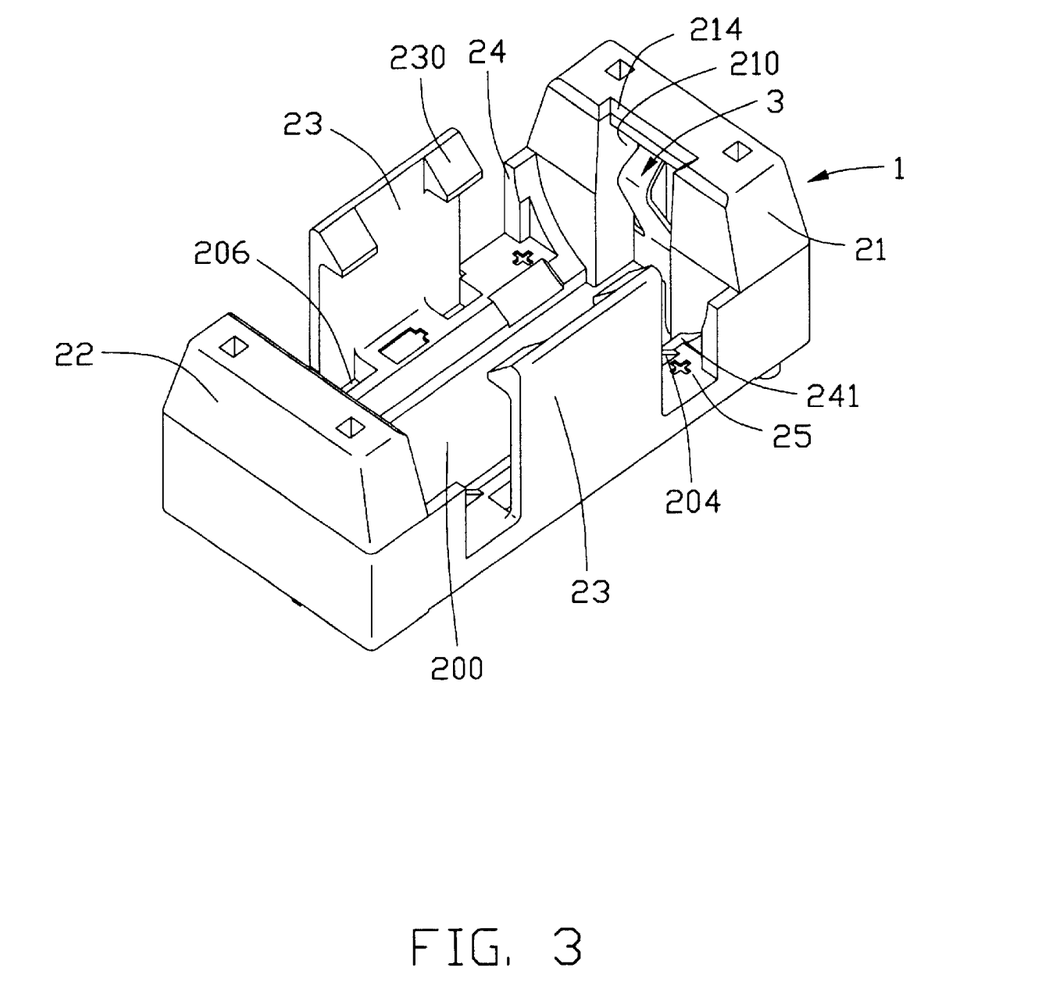
FIGS. 3–5 are assembled, perspective views of the battery holder of FIG. 1 taken from different perspectives.
Figure 4:
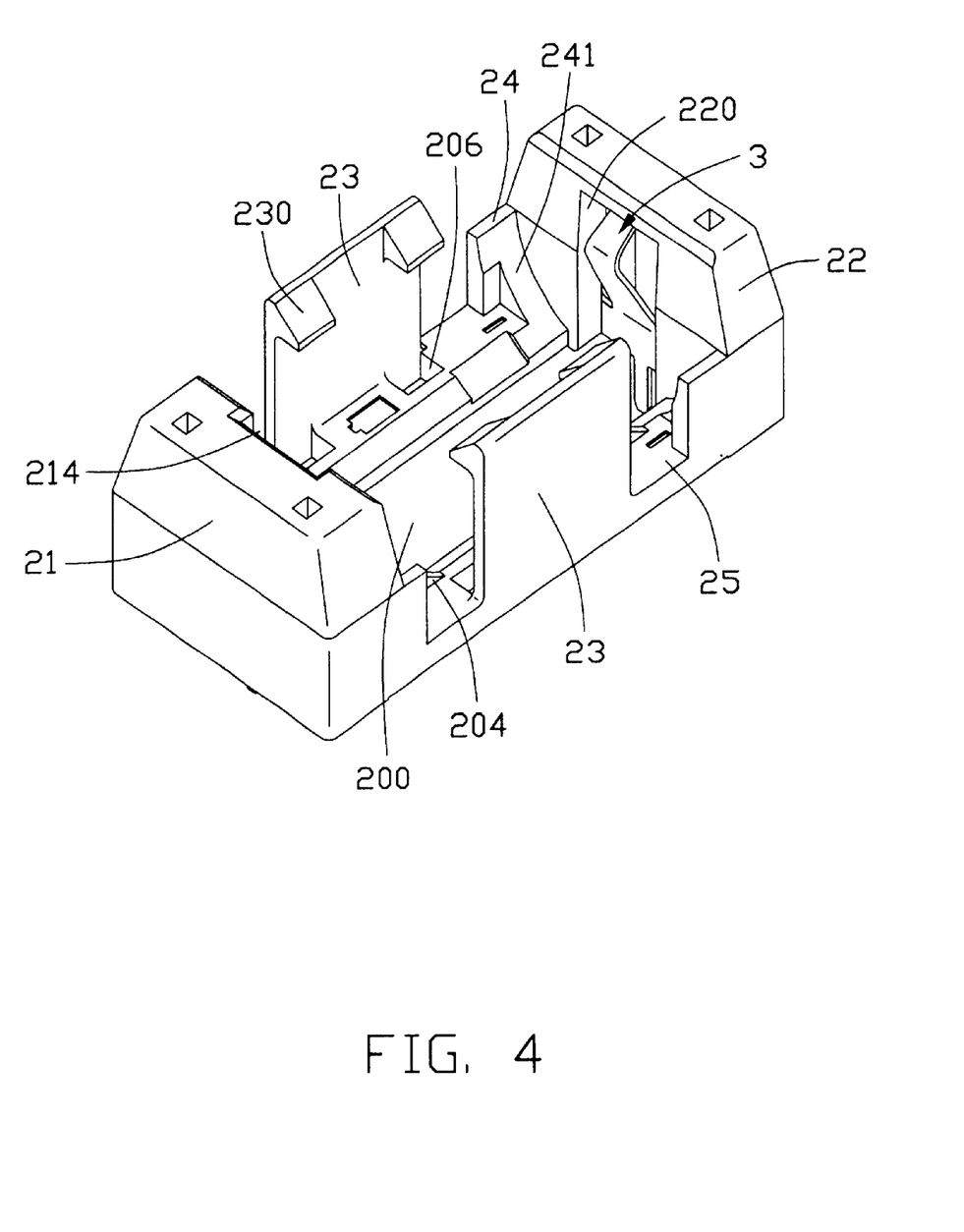
Figure 5:
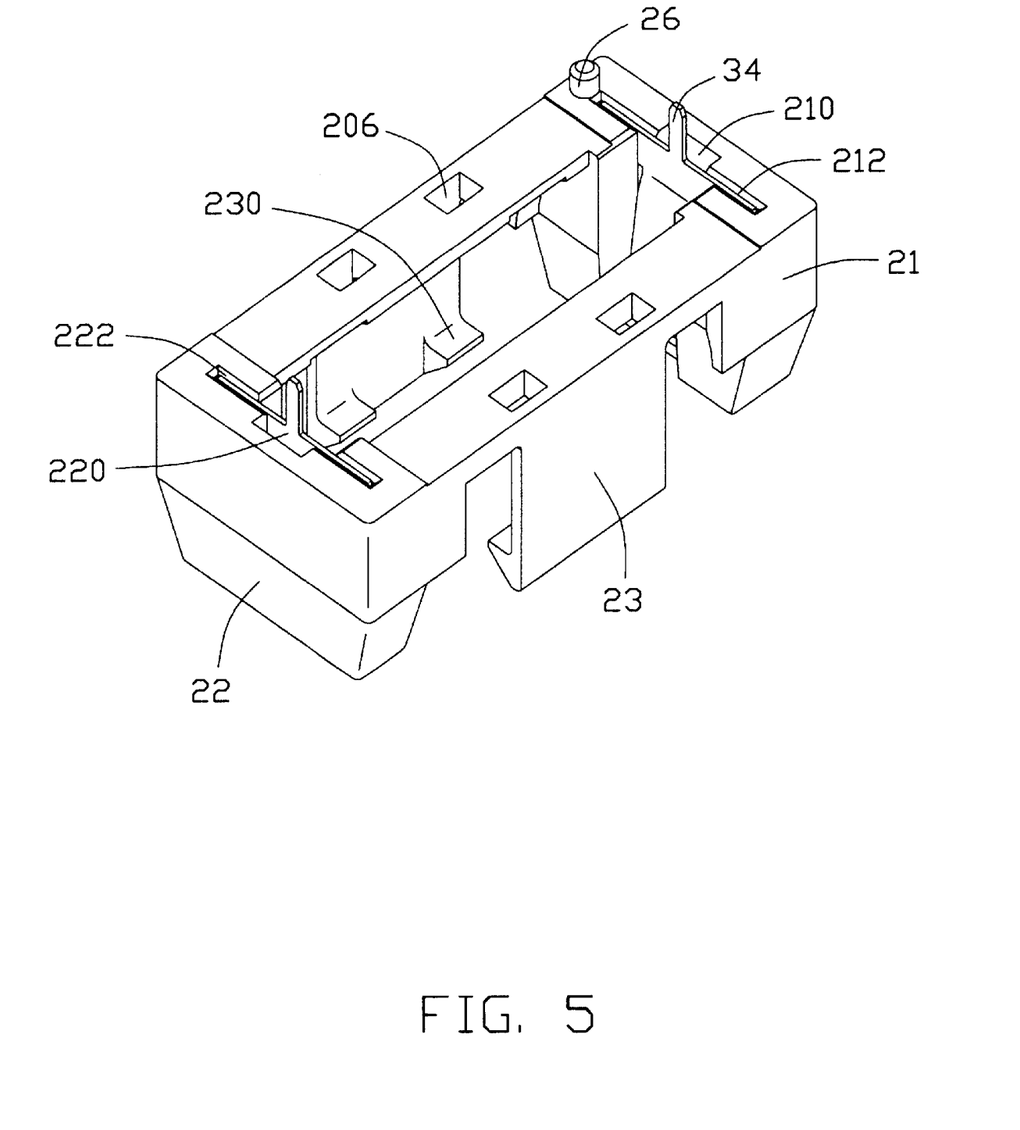
Figure 6:
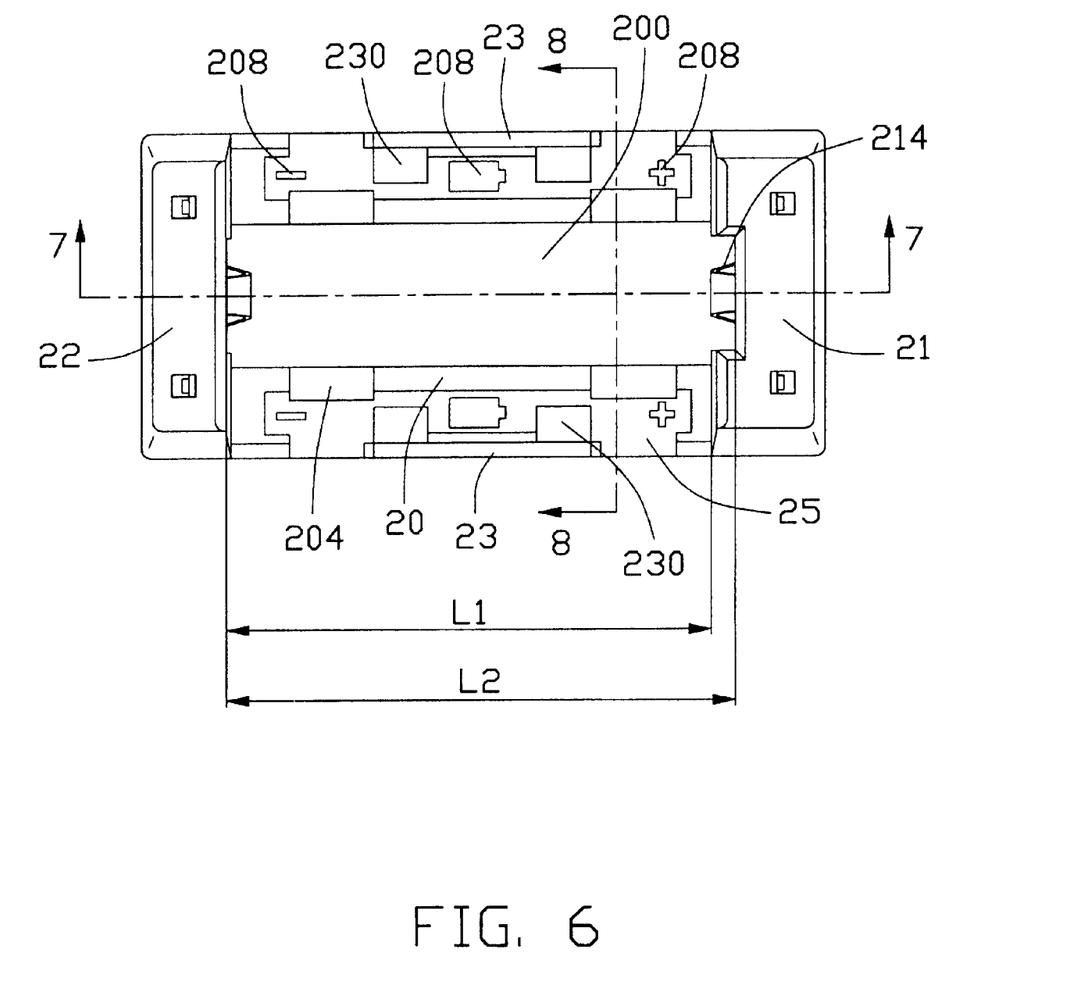
FIG. 6 is a top, plan view of the battery holder in FIG. 3.
Figure 7:
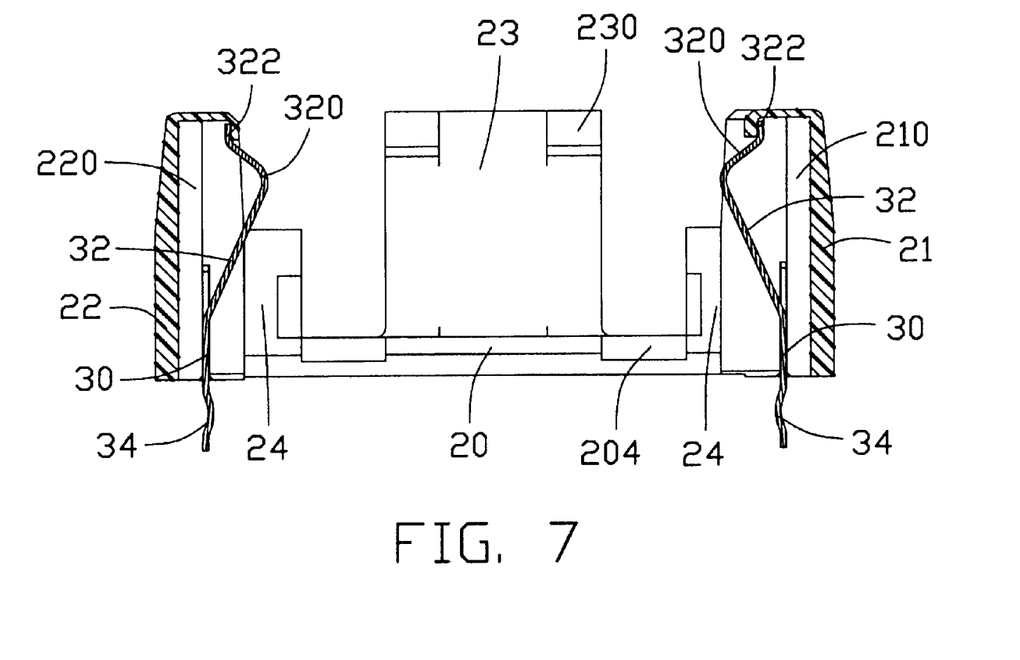
FIG. 7 is a cross-sectional view of the battery holder taken along section line 7—7 in FIG. 6.
Figure 8:
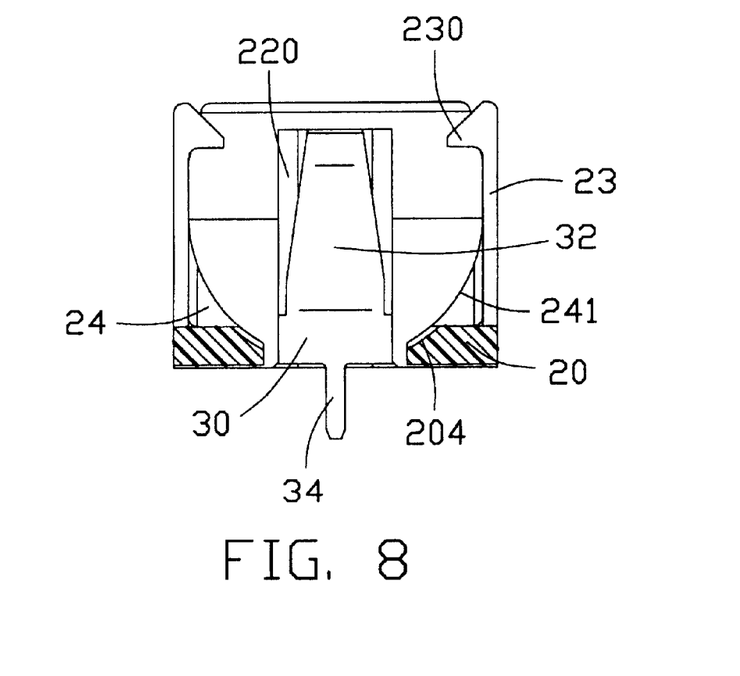
FIG. 8 is a cross-sectional view of the battery holder taken along section line 8—8 in FIG. 6.
Figure 9:
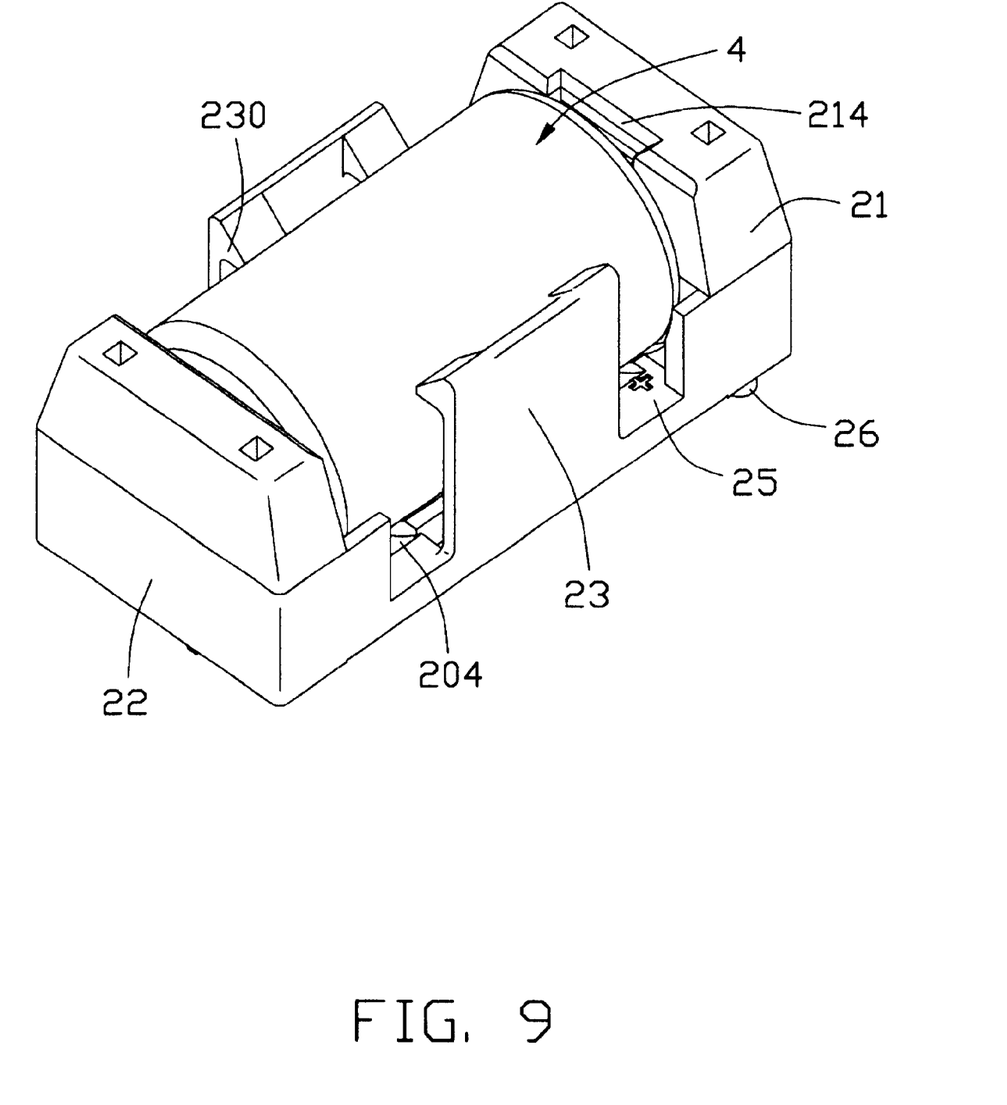
FIG. 9 is a perspective view showing a battery stably retained in the battery holder.
Figure 10:
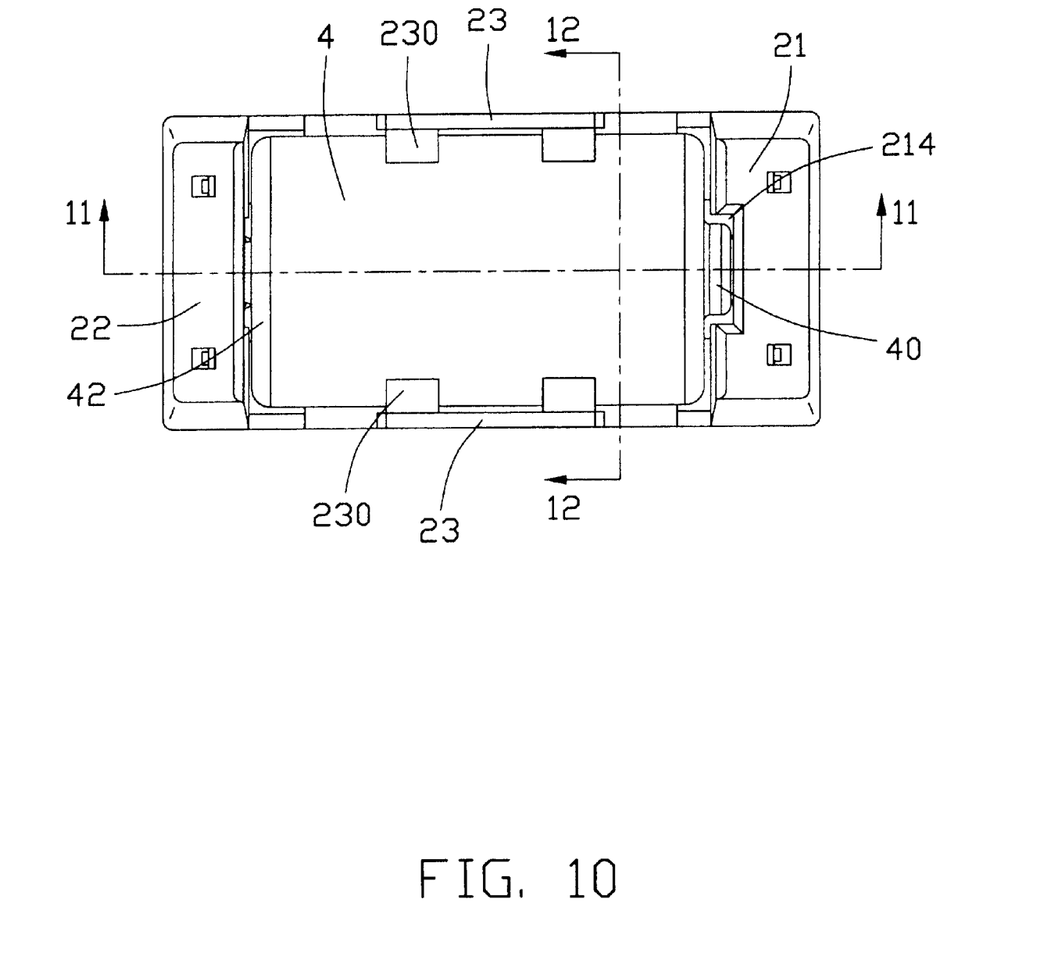
FIG. 10 is a top, plan view of FIG. 9.

Referring to FIGS. 1 and 2, a battery holder 1 for holding a ½AA battery 4 (shown in FIG. 9) in accordance with the present invention comprises a dielectric housing 2 and a pair of conductive contacts 3 for being stably retained in the housing 2.

Figure 11:
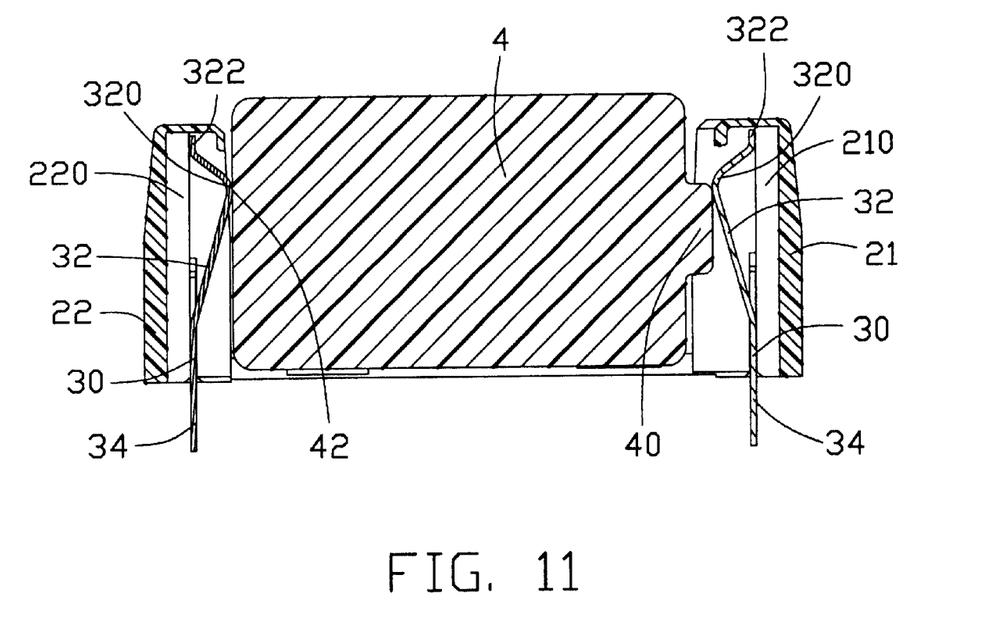
FIG. 11 is a cross-sectional view of the battery holder with the battery retained therein taken along section line 11—11 in FIG. 10.
Figure 12:
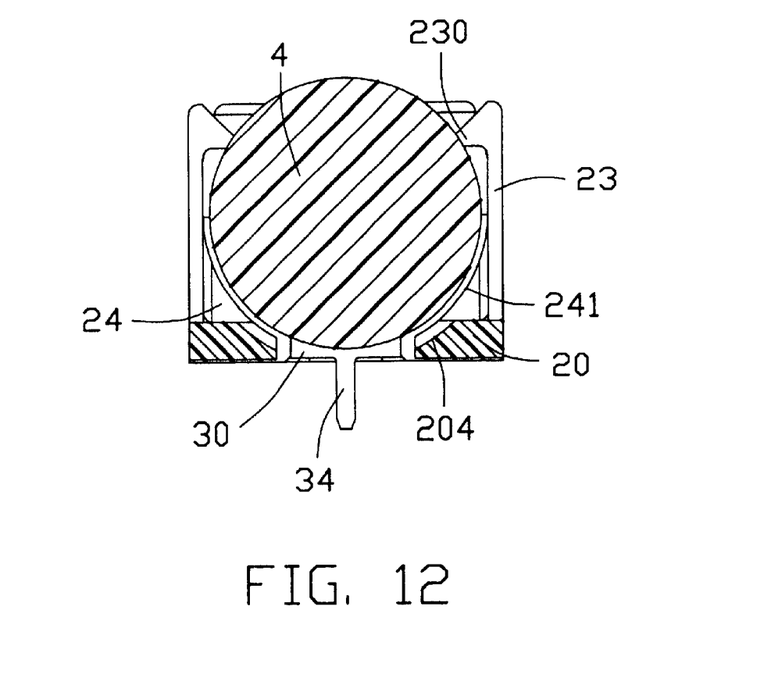
FIG. 12 is a cross-sectional view of the battery holder with the battery retained therein taken along section line 12—12 in FIG. 10.

The dielectric housing 2 includes a generally rectangular elongate base 20 with an opening 200 extending therethrough, a pair of upwardly extending end walls 21, 22 at opposite ends in a longitudinal direction of the base 20 and a pair of upwardly extending side beams 23 located between the end walls 21, 22 to define a receiving space 202 thereamong. Each side beam 23 includes a pair of hooks 230 extending inward at a top edge thereof for retaining the battery 4 in the housing 2. Each end wall 21 (22) defines a recess 210 (220) extending inwardly from an inner surface thereof, and a slit 212 (222) communicating with the recess 210 (220). An upper surface of the base 20 has indicia 208 molded therein to assist in a correct electrode orientation of the battery 4. The end wall 21 further defines a keyway 214 communicating with the receiving space 202 of the housing 2 in a top surface thereof for receiving a positive pole 40 (FIG. 11) of the battery 4 to ensure a blind insertion of the battery 4.

A pair of embossments 24 projects upwardly from the base 20 of the dielectric housing 2 and locates substantially close to each end wall 21 (22). Each embossment 24 has an upper curved surface 241 substantially conformed to the shape of the battery 4 for supporting the battery 4 at desired position in the housing 2. Four cutouts 25 are defined between the side beams 23 and the end walls 21, 22 for separating the side beams 23 from the end walls 21, 22, thereby improving the elasticity of the side beams 23. The base 20 is formed with four concaves 204 adjacent to the opening 200 corresponding to the four cutouts 25 for accommodating a manipulating tool, such as a screwdriver (not shown). The housing 2 has a positioning post 26 downwardly extending from the base 20 for being inserted into a corresponding positioning hole of a circuit board (not shown) on which the holder 1 is mounted for ensuring a correct electrical orientation thereof.

The dielectric housing 2 is preferably molded of a suitable nonconductive polymer, such as a polyester or other polymeric material. The molded housing 2 has four through holes 206 formed on the base 20 each being vertically aligned with a corresponding hook 230. It can be understood that molds used for molding the housing 2 can be opened in a vertical direction to successfully form the hooks 230. Nevertheless, to form the hooks on the housing in the past, it is required an additional slide structure to achieve the object of opening the molds in one direction. Thus, molding the housing 2 of the present invention is simple and feasible, thereby reducing the manufacturing cost.

Further referring to FIGS. 3–8 in conjunction with FIGS. 1 and 2, the pair of conductive contacts 3 are respectively installed into the end walls 21, 22 from a bottom surface of the base 20. Each of the conductive contacts 3 is stamped from a single piece of metal plate and includes a body portion 30 retained in the slit 212 (222) of the housing 2, a resilient arm 32 integrally upwardly extending from a middle section of the body portion 30 and projecting into the recess 210 (220) of the housing 2 for resiliently biasing against a corresponding end of the battery 4, and an integrally downwardly extending tail 34 for electrically connecting to the circuit board. The resilient arm 32 is generally of a S-shaped configuration having an inward projection 320, and a free end portion 322 biasing against a stop surface (not labeled) of the recess 210 (220) for providing preloading force, as clearly shown in FIG. 7. The body portion 30 further has a pair of integrally stamped spring tabs 300 at opposite ends thereof for interference fitting with the housing 2 to ensure the conductive contact 3 being stably retained in the housing 2.

Referring to FIGS. 9–12, the battery 4 is installed into the receiving space 202 of the housing 2 in a top-to-bottom direction. A horizontal distance "L1" (FIG. 6) between the inner surfaces of the end walls 21, 22 is smaller than a length of the battery 4. A horizontal distance "L2'"" (FIG. 6) between the inner surface of the end wall 22 and a stop surface of the keyway 214 is at least about equal to a length of the battery 4. In addition, the keyway 214 has a configuration that is only adapted to receive the positive pole 40 of the battery 4. Thus, when the positive pole 40 of the battery 4 is aligned with the keyway 214, the battery 4 can be successfully installed into the receiving space 202 of the housing 2 in a vertical direction. Contrarily, if the negative pole 42 of the battery 4 faces the keyway 214 due to a user's negligence, the battery 4 is obviously prevented from being inserted into the housing 2 by the inner surfaces of the end walls 21, 22. It can be understood that the keyway 214 is defined to polarize the battery 4 in a correct electrical orientation, i.e., positive to positive and negative to negative. Once the battery 4 is completely received, in the receiving space 202 of the housing 2, the inward projections 320 of the conductive contacts 3 respectively abut against the positive pole 40 and a negative pole 42 of the battery 4. The hooks 230 of the side beams 23 snugly contact with the exterior surface of the battery 4 to exert a force toward the base 20 for resisting the battery 4 against upward movement from the holder 1. Therefore, the battery 4 is stably retained in the housing 2 and a reliable electrical connection is established between the battery 4 and the circuit board.

When it is required to withdraw the battery 4 from the holder 1, a tip of the screwdriver is inserted into the concave 204 through the corresponding cutout 25 by a user and exerts an upward force on the battery 4, thereby releasing an engagement between the hooks 230 of the side beams 23 and the battery 4. Thereafter, the user can easily remove the battery 4 from the holder 1.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A battery connector assembly comprising:

a dielectric housing including a pair of upstanding end walls at two opposite ends thereof;

a battery receiving space defined between said pair of end walls; one of the end walls defining a keyway to receive a positive pole of the battery but exclude a negative pole of the battery from being inserted thereto;

a pair of terminals being located in said pair of end walls, respectively;

two pairs of embossments located adjacent to inner sides of said pair of end walls, respectively, each pair of said embossments forming a pair of upward arcs facing to each other;

a pair of side beams spatially located between said two pairs of embossments with hooks thereon, respectively; and a cylindrical battery horizontally located in the battery receiving space with two opposite electrodes mechanically and electrically engaged with the corresponding terminals, respectively; wherein a lower half arc portion of the battery is conformably supportably seated upon the embossments, and an upper half arc portion of the battery is latchably engaged with the hooks of the side beam.

* * * * *